United States Patent
Webster et al.

(10) Patent No.: US 7,365,421 B2
(45) Date of Patent: Apr. 29, 2008

(54) IC CHIP PACKAGE WITH ISOLATED VIAS

(75) Inventors: Steven Webster, Miao-li (TW);
Ying-Cheng Wu, Miao-li (TW);
Kun-Hsieh Liu, Miao-li (TW);
Po-Chih Hsu, Miao-li (TW)

(73) Assignee: Altus Technology Inc., Chu-Nan, Miao-Li Hsien (TW)

( * ) Notice: Subject to any disclaimer, the term of this patent is extended or adjusted under 35 U.S.C. 154(b) by 219 days.

(21) Appl. No.: 11/262,876

(22) Filed: Oct. 31, 2005

(65) Prior Publication Data
US 2006/0097372 A1 May 11, 2006

(30) Foreign Application Priority Data
Nov. 5, 2004 (TW) .................. 93217723 U

(51) Int. Cl.
H01L 23/12 (2006.01)
H01L 23/48 (2006.01)
H01L 23/52 (2006.01)
(52) U.S. Cl. .............. 257/704; 257/784; 257/774; 257/783; 257/787; 257/E23.181
(58) Field of Classification Search .......... 257/784, 257/700, 774, 704, 783, E23.181
See application file for complete search history.

(56) References Cited

U.S. PATENT DOCUMENTS

| | | | | |
|---|---|---|---|---|
| 5,414,300 A | * | 5/1995 | Tozawa et al. ............ | 257/704 |
| 5,468,999 A | * | 11/1995 | Lin et al. ................... | 257/784 |
| 5,689,091 A | * | 11/1997 | Hamzehdoost et al. ..... | 174/255 |
| 5,761,044 A | * | 6/1998 | Nakajima .................. | 361/719 |
| 5,814,883 A | * | 9/1998 | Sawai et al. ............... | 257/712 |
| 5,861,670 A | * | 1/1999 | Akasaki ..................... | 257/737 |
| 6,809,413 B1 | * | 10/2004 | Peterson et al. ........... | 257/680 |

FOREIGN PATENT DOCUMENTS

CN 01200427.8 10/2001

* cited by examiner

*Primary Examiner*—Nitin Parekh
(74) *Attorney, Agent, or Firm*—Morris Manning Martin LLP; Tim Tingkang Xia, Esq.

(57) ABSTRACT

An IC chip package includes a substrate (2), a chip (5), a plurality of bonding wires (52), and a cover (6). The substrate has a top surface, a receiving chamber (23) having an opening at the top surface, a plurality of solder pads (3) arranged around the top surface and respectively corresponding to the solder pads arranged at a bottom surface opposite to the top surface, and a plurality of vias (4) having conductive material electrically connecting the top solder pads with the bottom solder pads defined therein. The chip is mounted in the receiving chamber, and has a plurality of chip solder pads (51) arranged around a top surface thereof. The bonding wires respectively electrically connect the top solder pads of the substrate with the chip solder pads. The cover is fastened to the top surface of the substrate, and covers the opening.

10 Claims, 2 Drawing Sheets

IC CHIP PACKAGE WITH ISOLATED VIAS

FIELD OF THE INVENTION

The present invention relates generally to an integrated circuit (IC) chip package, and more particularly to a small sized IC chip package with isolated vias.

BACKGROUND

FIG. 3 illustrates an IC chip package according to China Pat. No. 01200427.8 issued on Oct. 31, 2001. The IC chip package is constructed to include a substrate 10, a chip 12, a cover 13, and adhesive means 14. The substrate 10 includes a top side 101 and a receiving chamber 102. The receiving chamber 102 has an opening at the top side 101. The top side 101 is provided with a plurality of connecting pads arranged around the opening of the receiving chamber 102. The substrate 10 further includes a plurality of plated through holes 103 provided around a periphery thereof, in order to electrically connect the connecting pads at the top of the substrate 10 to a bottom of the substrate 10. The chip 12 is fixedly mounted in the receiving chamber 102. The chip 12 is provided with a plurality of connecting pads respectively electrically connected to the connecting pads of the substrate 10 by means of bonding wires 15. The adhesive means 14 is applied on areas where the bonding wires 15 connect with the connecting pads of the substrate 10. The cover 13 is fixedly fastened to the adhesive means 14, thereby covering the opening of the receiving chamber 102. When the IC chip package is installed on a circuit board, tin solder is applied to bottoms of the through holes 103. The chip 12 is thereby electrically connected to a conductive circuit pattern of the circuit board.

In this IC chip package, it is generally difficult to control the amount of the adhesive means 14 applied. If insufficient adhesive means 14 is used, the cover 13 may not properly adhere to the substrate 10. Over time, tiny gaps may form between the cover 13 and the top side 101 of the substrate 10. If this happens, moisture may penetrate inside the receiving chamber 102 and adversely affect the functioning of the chip 12. In addition, the cover 13 may become detached from the substrate 10, which frequently causes complete failure of the IC chip package. On the other hand, if excessive adhesive means 14 is used, the adhesive means 14 is liable to overflow down along the through holes 103 to the bottom of the substrate 10. If this happens, the adhesive means 14 may form insulating coatings on the bottoms of the through holes 103, which frequently results in the substrate 10 being unable to properly electrically connect with the circuit board. Either way, the quality and/or reliability of the IC chip package is liable to be reduced.

Furthermore, the through holes 103 are exposed to ambient air, and are liable to be affected by oxidation or contamination. This can lead to faulty electrical connection of the substrate 10 with the circuit board.

What is needed, therefore, is an IC chip package with isolated vias having high quality and reliability.

SUMMARY

In a preferred embodiment, an IC chip package includes a substrate, a chip, a plurality of bonding wires, and a cover. The substrate includes a top surface, a bottom surface opposite to the top surface, a receiving chamber having an opening at the top surface, a plurality of solder pads arranged around the top surface and the bottom surface, and a plurality of vias. The bottom solder pads respectively correspond to the solder pads arranged around the top surface. The vias are defined in the substrate, and having conductive material defined therein in order to electrically connect the top solder pads with the bottom solder pads. The chip is mounted in the receiving chamber of the substrate, and includes a plurality of solder pads arranged around a top surface thereof. The bonding wires respectively electrically connect the top solder pads of the substrate and the solder pads of the chip. The cover is fastened to the top surface of the substrate, and covers the opening.

Other advantages and novel features will become more apparent from the following detailed description of preferred embodiments when taken in conjunction with the accompanying drawings, in which:

DETAILED DESCRIPTION OF THE PREFERRED EMBODIMENTS

Figure 1:
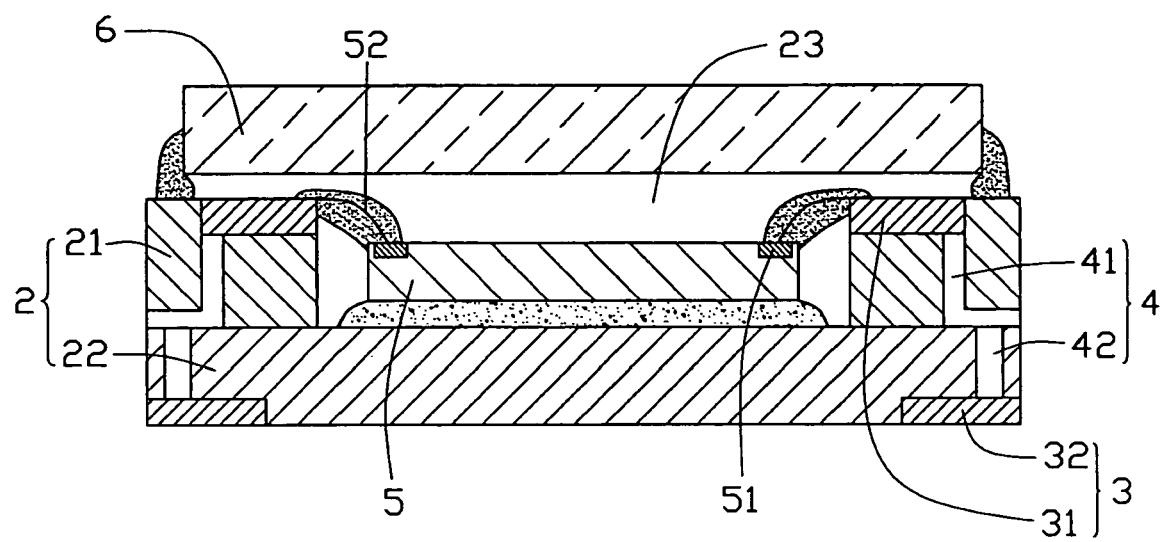
FIG. 1 is a schematic, cross-sectional view of an IC chip package constructed according to one embodiment of the present invention, the IC chip package including a cover and portions of adhesive.
Figure 2:
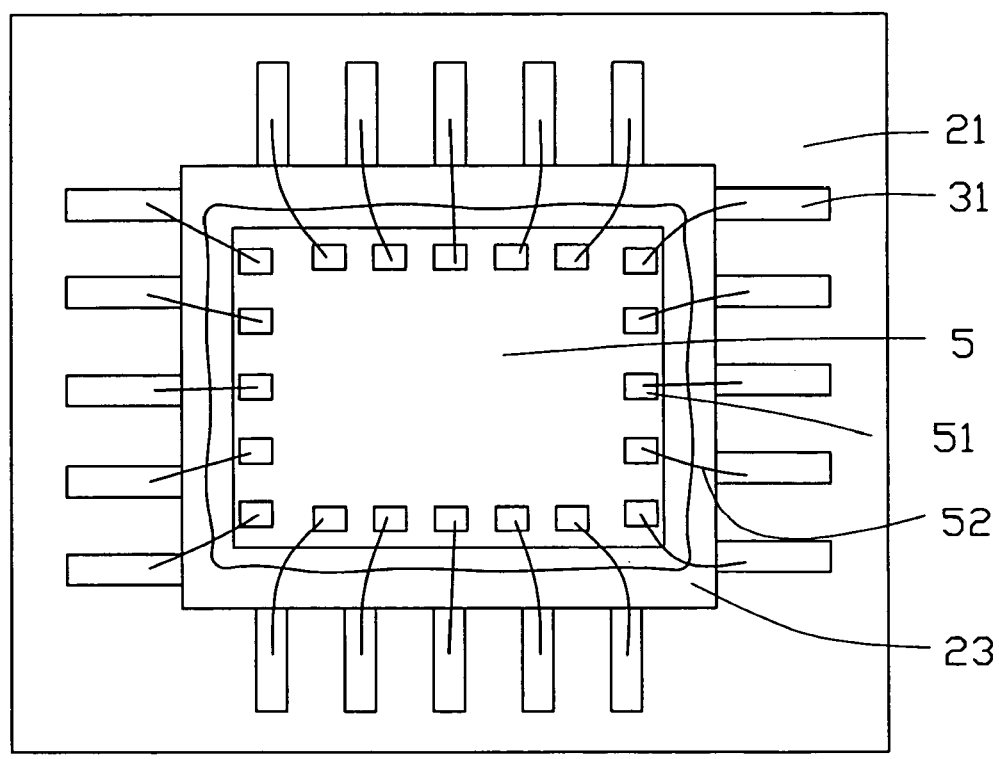
FIG. 2 is a top plan view of the IC chip package of FIG. 1, but not showing the cover nor certain portions of the adhesive.
Figure 3:
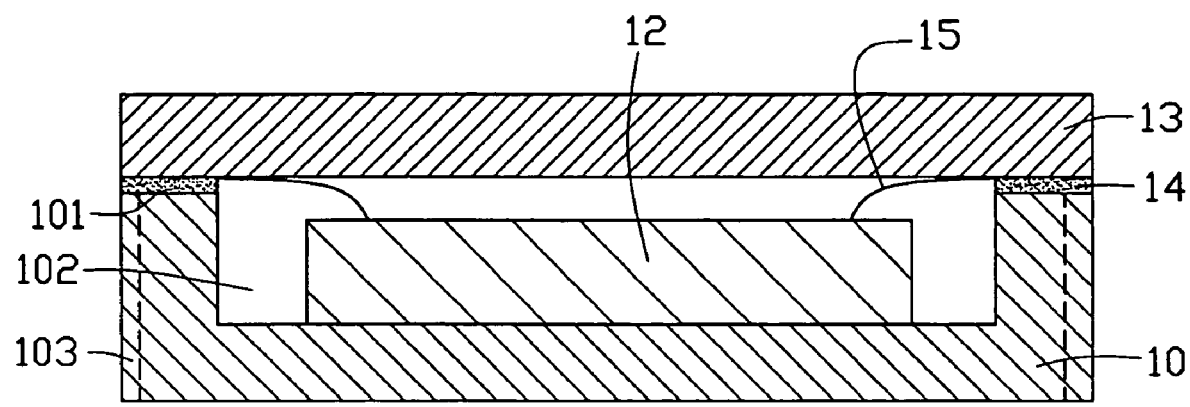
FIG. 3 is a schematic, cross-sectional view of a conventional IC chip package.

Referring to FIG. 1 and FIG. 2, an electronic package like an IC chip package in accordance with one embodiment of the present invention is shown. The IC chip package includes a substrate 2, a plurality of electrical conductors like solder pads 3, a plurality of connecting means like vias 4, a chip 5, a plurality of bonding wires 52, and a cover 6.

The substrate 2 is made of a material such as a ceramic material or a fibrous composite material. The substrate 2 includes a frame substrate 21 and a board substrate 22. The frame substrate 21 is fixedly mounted on a top surface of the board substrate 22 to form the substrate 2. The top surface of the board substrate 22 and an inner wall of the frame substrate 21 cooperatively define a receiving chamber 23 therebetween. The receiving chamber 23 includes an opening at a top surface of the substrate 2. The opening communicates with an outside, so that the receiving chamber 23 can receive an electronic component such as the chip 5.

The top surface and a bottom surface opposite to the top surface of the substrate 2 are provided with the solder pads 3, in order to electrically connect the chip 5 on the substrate 2 with an electronic component such as a circuit board (not shown). The solder pads 3 include a plurality of top solder pads 31 as first electrical conductors embedded in the top surface portion of the substrate 2. Each top solder pad 31 corresponds to a respective bottom solder pad 32 as a second electrical conductor embedded in a peripheral region of a bottom surface portion of the substrate 2. An outer end of each top solder pad 31 is spaced a certain distance from an outer wall of the substrate 2.

The vias 4 are defined in the substrate 2 between the top solder pads 31 and the bottom solder pads 32. The vias 4 include a plurality of top via portions 41 defined in the frame substrate 21, and a plurality of bottom via portions 42 defined in the board substrate 22. Each top via portion 41 corresponds to and communicates with a respective bottom via portion 42 when the frame substrate 21 is fixedly mounted on the board substrate 22. A top of each top via portion 41 is covered by a respective top solder pad 31, and a bottom of each bottom via portion 42 is covered by a respective bottom solder pad 32. Each via 4 is filled with or plated with a conductive material, in order to electrically connect the top solder pad 31 with the corresponding bottom solder pad 32. In the illustrated embodiment, each via 4 further includes an offset like a horizontal intermediate via portion (not labeled) interconnecting the top via portion 41 with the bottom via portion 42. The intermediate via portion is defined in a bottom surface portion of the frame substrate 21. Alternatively, the intermediate via portion can be defined in a top surface portion of the board substrate 22, or in both the bottom surface portion of the frame substrate 21 and the top surface portion of the board substrate 22. In the illustrated embodiment, each intermediate via portion comprises a termination at the outer wall of the substrate 2.

In a further alternative embodiment, each top via portion 41 is aligned with a corresponding bottom via portion 42. That is, there are no intermediate via portions. This facilitates easy manufacturing of the substrate 2 with the vias 4.

The chip 5 is glued to a bottom of the receiving chamber 23. A peripheral region of a top surface of the chip 5 is provided with a plurality of chip solder pads 51.

The bonding wires 52 are made of conductive material such as gold or aluminum alloy. One end of each bonding wire 52 is connected to a respective top solder pad 31 of the substrate 2, and the other end of the bonding wire 52 is connected to a respective chip solder pad 51 of the chip 5. Adhesive is applied to cover the bonding wires 52, and areas where the bonding wires 52 connect with the top and chip solder pads 31, 51. The adhesive may for example be a silicone, epoxy, acrylic, or polyamide adhesive. The adhesive provides a protective coating for the bonding wires 52, and reinforces the connections of the ends of the bonding wires 52 with the top solder pads 31 and the chip solder pads 51.

The cover 6 can be an opaque plate member or a transparent plate member. Sides of the cover 6 can be glued to the top surface of the frame substrate 21 in order to cover the opening of the receiving chamber 23. The chip 5 is thereby protected from external impact or contamination.

In the preferred embodiments, it is of advantage that the vias 4 are defined in the substrate 2 and covered by the top solder pads 31 and the bottom solder pads 32. This helps prevent the adhesive from entering the vias 4. In addition, the vias 4 are isolated from ambient air, so that the conductive material therein is protected from oxidation and contamination. Furthermore, the protective coatings protect the bonding wires 5 from breakage. Moreover, the top solder pads 31 are spaced a certain distance from the outer wall of the substrate 2. Therefore when the adhesive is applied to cover the areas where the bonding wires 5 connect with the top solder pads 31, there is minimal risk of excess adhesive overflowing down along the outer wall of the substrate 2. These benefits help prolong the reliability and useful working lifetime of the IC chip package.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. An IC (integrated circuit) chip package comprising:
   a substrate comprising:
   a top planar surface;
   a bottom surface opposite to the top surface;
   a receiving chamber, having an opening at the top planar surface;
   a plurality of solder pads arranged on the top planar surface;
   a plurality of solder pads arranged on the bottom surface, respectively corresponding to the solder pads arranged on the top planar surface; and
   a plurality of vias defined therein, the vias having conductive material electrically connecting the solder pads on the top and the bottom surfaces;
   a chip mounted in the receiving chamber of the substrate, the chip comprising a plurality of solder pads arranged around a top surface thereof;
   a plurality of bonding wires respectively directly electrically connecting the solder pads on the top surface of the substrate and the solder pads of the chip;
   an adhesive means applied to exclusively cover the bonding wires and areas where the bonding wires connect with the solder pads on the top surface of the substrate and the solder pads of the chip; and
   a cover glued directly to the top planar surface of the substrate and covering the opening such that the solder pads on the top planar surface are partially exposed at the top planar surface, the cover providing a clearance above the solder pads on the top planar surface.

2. The IC chip package as claimed in claim 1, wherein the substrate comprises a board substrate, and a frame substrate mounted on top of the board substrate.

3. The IC chip package as claimed in claim 1, wherein an outer end of each top solder pad is spaced a distance from an outer wall of the substrate.

4. The IC chip package as claimed in claim 2, wherein the vias comprise a plurality of top via portions defined in the frame substrate, and a plurality of bottom via portions defined in the board substrate respectively communicating with the top via portions.

5. The IC chip package as claimed in claim 4, wherein the top via portions are aligned with the corresponding bottom via portions.

6. The IC chip package as claimed in claim 4, wherein each of the top via portions communicates with the corresponding bottom via portion via a respective intermediate via portion.

7. The IC chip package as claimed in claim 6, wherein the intermediate via portion is defined in a bottom surface portion of the frame substrate, or in a top surface portion of the board substrate, or in both the bottom surface portion of the frame substrate and the top surface portion of the board substrate.

8. The IC chip package as claimed in claim 6, wherein the intermediate via portion comprises a termination at an outer wall of the substrate.

9. An electronic package comprising:
   a substrate of said electronic package comprising a receiving chamber therein, said receiving chamber having an opening formed at a side surface of said substrate, at least one first electrical conductor disposed on said side surface of said substrate around said opening and a second electrical conductor corresponding to each of said at least one first electrical conductor located at another surface of said substrate different from said side surface of said substrate, a connecting means formed in said substrate and electrically connected between said second electrical conductor and said each of said at least one first electrical conductor, said connecting means comprising an offset between said second electrical conductor and said each of said at least one first electrical conductor so as to disable straightly spatial communication between said second electrical conductor and said each of said at least one first electrical conductor via said connecting means;

an electronic component mounted in said receiving chamber of said substrate, and comprising at least one electrical conductor disposed on a top surface thereof;

at least one bonding wire electrically connecting each of said at least one first electrical conductor with a corresponding one of said at least one electrical conductor of said electronic component;

an adhesive means applied to exclusively cover the at least one bonding wire and areas where the at least one bonding wire electrically connects with each of said at least one first electrical conductor and with said corresponding one of said at least one electrical conductor of said electronic component; and a cover glued to a planar top surface of said substrate around said opening of said receiving chamber so as to cover said opening and isolate said receiving chamber from an outside of said substrate and partially exposing said at least one first electrical conductor.

10. The electronic package as claimed in claim 9, wherein said connecting means is a via comprising an intermediate via portion in said substrate as said offset, and said electronic component is an integrated circuit (IC) chip.

* * * * *